United States Patent [19]
Augustine

[11] 3,946,423
[45] Mar. 23, 1976

[54] OPTO-COUPLER

[75] Inventor: Lawrence G. Augustine, Phoenix, Ariz.

[73] Assignee: Motorola, Inc., Chicago, Ill.

[22] Filed: May 2, 1974

[21] Appl. No.: 466,586

[52] U.S. Cl. .................... 357/30; 357/19; 357/48
[51] Int. Cl.² ........................................ H01L 27/14
[58] Field of Search ........................ 357/30, 19, 48

[56] References Cited
UNITED STATES PATENTS

| | | | |
|---|---|---|---|
| 3,532,945 | 10/1970 | Weckler | 317/235 |
| 3,836,793 | 9/1974 | Haitz | 307/303 |

Primary Examiner—Martin H. Edlow
Attorney, Agent, or Firm—Harry M. Weiss; Kenneth R. Stevens

[57] ABSTRACT

An opto-coupler for isolating electrical signals constituted by an electrically responsive radiation source or emitting device, such as a light emitting diode (LED), optically coupling to a radiation sensitive detector for generating an electrical output in response to an electrical signal applied to the radiation source. The detector includes a PN junction positioned within a semiconductor body for generating maximum output current at high switching speeds with attendant minimization of capacitance. Increased values of detector current generation allow economical, reliable, and uncomplicated integrated circuit amplifying means to be responsive to the generated detector output current for generating increased current and voltage output signals, for example, TTL compatible, without speed degradation and readily implementable on a single small semiconductor integrated circuit chip or substrate. The detector chip and radiation or light emitting diode source can be readily mounted in an electronic package to provide an inexpensive opto-coupler unit.

13 Claims, 3 Drawing Figures

OPTO-COUPLER

BACKGROUND OF THE INVENTION

1. Field of Invention

This invention relates to an electrical isolation circuit and more particularly to an opto-coupler electrical isolation circuit.

2. Discussion of The Prior Art

An opto-coupler has found wide acceptance in many applications as a means of isolating electrical signals from each other. For example, peripheral equipment associated with computer systems are often subjected to large transient currents which flow into the ground loop or ground line and as a result cause the ground line to rise in voltage. Servo motors are often required to drive output devices such as tape decks and necessitate output voltages in the 150 V and upward range. The transient or surge currents often cause the ground line to rise by more than 5 or 6 volts which in turn causes a feedback from the output to input devices and back to the main frame of the computer, thus triggering erroneous circuit operation. An opto-coupler is an ideal structure for positively eliminating this feedback in an inexpensive and reliable manner.

Existing opto-couplers are extremely expensive and require complex amplifying circuits on one hand, or in the alternative operate at inadequate switching speeds and signal levels thus making them undesirable and impractical for many applications.

One prior art opto-coupler employs a radiation source, such as a light emitting diode, and a silicon diode detector. The diode detector is constituted by a monolithic structure comprising a substrate, an N epitaxial layer, and a surface diffused P-region for forming the PN junction. With the PN junction reversed biased, a minority carrier current is generated by the movement of electrons from the P-diffused region into the epitaxial layer and the movement of holes from the N epitaxial layer into the P-diffused region. The miniority carrier current primarily occurs by the generation of electron hole pairs in the N epitaxial region upon the incidence of radiation. This type of detector suffers from major drawbacks.

It is recognized that for integrated circuit application it is desirable to provide conventional active devices on the same chip or substrate with the detector. Accordingly, it is most advantageous that the detector device be capable of being fabricated by standard integrated processing techniques. Most advantageously these techniques dictate that the epitaxial thickness be in the order of five to ten microns. However, if the prior art detector is fabricated in a thin epitaxial layer much of the incident radiation passes through the two active regions constituting the PN junction, that is, the upper surface planer P-diffused region and the N epitaxial region without being completely absorbed. Consequently, the surface diode detector is incapable or is limited in the magnitude of current which is capable of generating from the incident radiation. For example, with a sixteen milliamp current being applied to a gallium arsenide LED radiation source and the conventional silicon diode detector located in the N epitaxial region, approximately 5 to 8 microamperes of current is generated, and this low level of generated current in turn gives rise to two attendant problems.

Firstly, the switching response time of the detector is inversely proportional to the generated current. By way of example, for 10 microamperes and a 10 micro-micro farad capacitor associated with the detector (a capacitor in parallel with a current source is the diode detector equivalent), it would take approximately 5 micro seconds to generate a 5 volt signal across the detector. This response time is unacceptable from many applications and accordingly would require additional integrating circuits to increase the response time, or would require high beta transistors or Darlington configurations with the obvious attendant disadvantages.

Secondly, the low magnitude of current generated by the detector would require a great number of sophisticated and costly amplifying stages in order to be capable of generating a sixteen milliampere output current from a 10 micro ampere detector current. As many as 15 or 20 transistors sometimes are required for this amplification function is some known prior art units.

An ostensible solution to this problem caused by incomplete absorption of the incident radiation within the active regions is to increase the epitaxial thickness. An epitaxial thickness of thirty microns has been suggested in order to insure substantially complete absorption by the active regions employed to generate the miniority carrier current in the device detector and thus increase the magnitude of the generated currents. An apparent additional solution is to increase the N epitaxial resistivity from 1 ohm cm. to 30 ohm cm. However, these alternatives create severe processing problems for optimized integrated circuit implementation.

The processing time to form junction isolation in a thick epitaxial region is extremely long and would cause extensive surface damage as well as being difficult to control. Other forms of isolation processes would also be extremely expensive, impractical, or difficult to achieve with extremely large epitaxial thicknesses, or diffused layers.

SUMMARY OF THE INVENTION

It is therefore an object of the present invention to provide an improved, economical, and reliable opto-coupler unit.

Another object of the present invention is to provide an improved opto-coupler unit having a radiation detecting device capable of generating increased signal levels without sacrificing response speeds.

Another object of the present invention is to provide an improved opto-coupler unit having a detecting device which maximizes utilization of incident radiation.

A further object of the present invention is to provide an opto-coupler unit having a detecting device for producing desirable current levels while minimizing undesirable effects of parasitic capacitance.

A further object of the present invention is to provide an opto-coupler unit wherein the detecting device can be readily integrated in an inexpensive manner on a single chip for providing the radiation detection and amplification with a minimal number of components.

Another object of the present invention is to provide an opto-coupler unit having a detecting device which can be fabricated inexpensively, reliably, and with high yields in accordance with established high performance integrated circuit processing techniques.

Another object of the present invention is to provide an opto-coupler having a detecting device which when implemented in integrated circuit form possesses minimum undesirable capacitance, optimum compatability with thin epitaxial and diffused layer integrated circuit processing techniques, for example, 5 to 8 microns, and optimum compatibility with idealized epitaxial resistivity, for example 1 or 2 ohm cm. resistivity values.

Another object of the present invention is to provide an opto-coupler unit in which the detecting and amplifying function can be fabricated on a single semiconductor chip having significantly reduced overall dimensions then was previously obtainable.

Another object of the present invention is to provide an improved opto-coupler unit which can be economically and readily packaged with a minimum number of wiring or lead restraints.

Another object of the present invention is to provide an improved opto-coupler unit having a radiation detective device and amplifying circuitry having improved power dissipation characteristics.

A further object of the present invention is to provide an improved opto-coupler unit having a diode and amplifying section which requires a minimum number of components, but yet is still capable of generating a sufficiently high output voltage level compatible with transistor-transistor logic, TTL.

Another object of the present invention is to provide an improved opto-coupler circuit having a radiation detecting device which does not require extremely high beta transistors or Darlington circuits in order to provide fast response time and output voltage levels compatible with a TTL logic family.

A further object of the present invention is to provide an improved opto-coupler unit having a radiation detecting device capable of generating current over a much larger active integrated circuit area without increasing its silicon area over prior art integrated circuits, and in fact reducing the silicon area over that previously known.

In accordance with the aforementioned objects, the present invention provides an opto-coupler unit readily packaged into a single package having a radiation emitting device energized by an electrical input and a physically separated detecting device responsive to incident radiation for generating an output voltage electrically isolated from the electrical signal applied to the radiation source. The device includes an optimum semiconductor diode device constituted by first and second active regions disposed within a semiconductor body for absorbing a maximum amount of incident radiation so as to minimize incident radiation transmittal losses.

DESCRIPTION OF THE PREFERRED EMBODIMENTS

Figure 1:
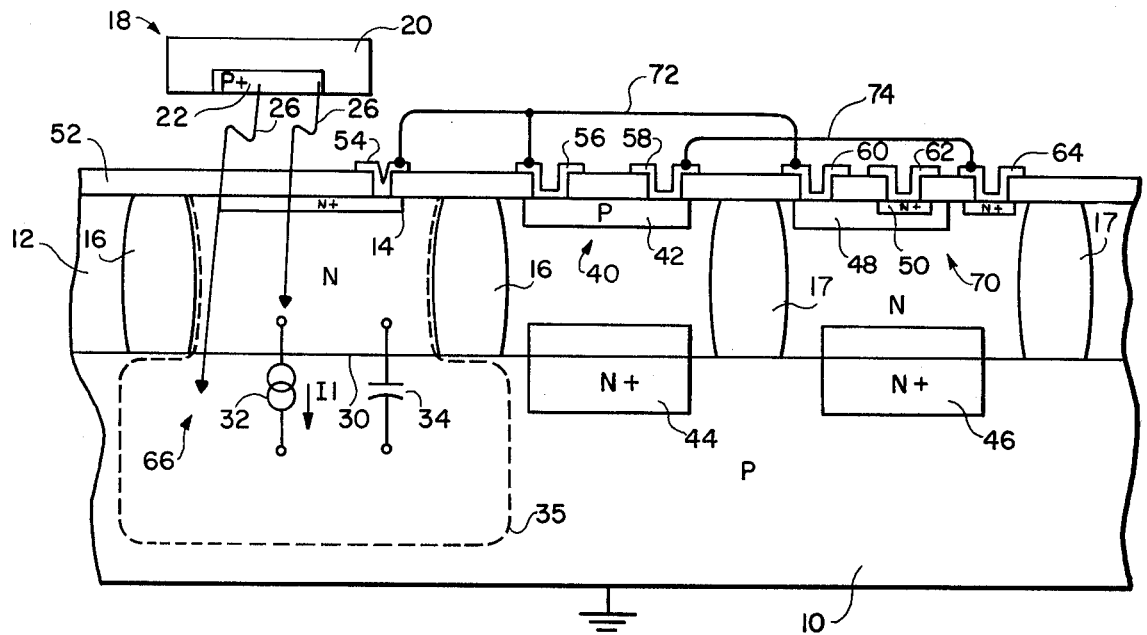
FIG. 1 is a schematic view of cross section, partially broken away, of the radiation source and the improved detecting device of the present invention.

Now referring to FIG. 1, it illustrates one preferred embodiment device structure of the present invention.

In order to form the semiconductor detecting diode and attendant amplifying generated circuit on a single monolithic chip, a starting P-conductivity substrate 10 is employed. In the preferred embodiment, the substrate 10 possesses a resistivity of approximately 8 to 30 ohm cm. resistivity and a thickness of approximately 5 mils or 125 microns. An N-conductivity type layer 12 is deposited over the starting substrate 10. In the preferred embodiment, layer 12 is constituted by an epitaxially grown material having a 1 to 3 ohm cm. resistivity and a thickness of approximately 5 to 8 microns. In order to provide an electrical contact to the semiconductor detecting diode an N+ conductivity type region 14 is formed in the layer 12 and a P+ conductivity type isolation region 16 is employed in order to electrically isolate the diode. In the preferred embodiment, the isolated region 16 and N+ conductivity region 12 are formed by diffusion.

The light generating device which is positioned vertically above the light detecting device and separated therefrom is schematically illustrated as a gallium arsenide or gallium arsenide phosphide light emitting diode 18 (LED) comprising an N type substrate 20 having a P+ region 22 formed therein. Electrical exitation of the LED junction causes infrared radiation schematically depicted as 26 to be emitted from the LED source and impinge upon and be absorbed by the radiation diode detecting device.

The PN junction formed between the substrate 10 and the layer 12 forms a PN junction indicated at 30 is bounded by an active N and P regions located in the layer 12 and substrate 10, respectively. From an electrical standpoint, the detecting diode is schematically equivalent to a current source and parallel capacitor and is represented schematically by elements 32 and 34, respectively, extending across the pair of active N and P regions. The dotted line 35 represents the total area which is capable of generating electron-hole movement across the reverse biased PN junction 30 in order to cause electron-hole recombination and thus generate an output current in response to the incident radiation 26. It is significant that with the diode detector of the present invention, the total active area is in the range of 30 to 50 microns thick and thus the incident radiation 26 generated by the LED radiation source 18 is substantially completely absorbed by the N and P active regions and thus maximum current levels are generated.

In actual implementation the radiation source 18 and the detector and amplifying chip are first encapsulated in a clear plastic environment and then sealed with a suitable exterior opaque case.

Only portion of the amplifying circuit employed to amplify the generated current of the diode detector is depicted, as the remaining integrated circuitry is of a conventional nature and is not illustrated for purposes of clarity. The electrical current generated by the diode detector is first amplified by a trans-impedance amplifier constituted by a resistor device 40 formed by a P type region 42 located in the N type epitaxial layer 12 and located over an N+ buried layer 44. A bipolar transistor constituted by a buried N+ layer 46, a P-conductivity base region 48 and an N+ emitter region 50 is also formed in the monolithic integrated circuit chip and is isolated by a P+ region depicted at 17 18.

A passivating insulating layer of material, such as silicon dioxide, is illustrated at 52 and is deposited over the upper surface of the N type epitaxial layer 12. Appropriate contact holes are open in order to provide a metallized contact 54 to the N+ diffused contact region 14, a pair of metallized contacts 56 and 58 to the P type diffused resistor 40, and base contact, emitter contact, and collector contact depicted at 60, 62, and 64, respectively. The metallized interconnecton between the diode detector, the P diffused resistor 40, and the transimpedance bipolar transistor generally designated as 66, 40 and 70 are interconnected by a metallized interconnection pattern deposited over the passivating layer 52, and for purposes of clarity is simply shown as interconnection lines 72 and 74.

Figure 2:
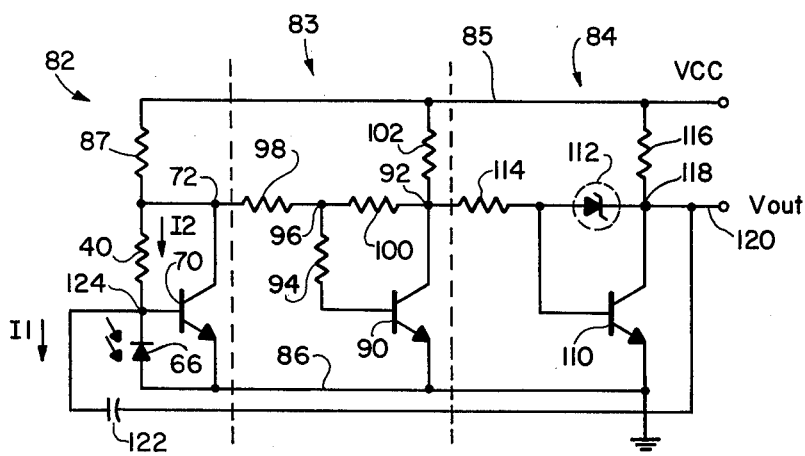
FIG. 2 is an electrical schematic diagram illustrating the incorporation of the improved radiation detecting device into an amplifying circuit for obtaining a high level output voltage with a minimum number of integrated circuit components.

Now referring to FIG. 2, it illustrates a complete schematic diagram of a monolithic integrated circuit containing the diode detector and amplifying circuitry, a portion of which was depicted in FIG. 1 in device form as detecting diode 66, resistor 40, and bipolar transistor 70.

With the improved detecting diode 66 of the present invention, minimal and uncomplicated amplifying circuitry is necessary. The circuit essentially comprises an input trans-impedance amplifier stage 82, an operational amplifier intermediate stage 83, and an output amplifier stage 84. The monolithic integrated circuit detecting and amplifying circuitry of the present invention not only requires minimal uncomplicated devices but also operates with minimal power requirements. The input trans-impedance stage converts the detected current of diode 66 into a voltage at node 72. The supply system for the present detecting and amplifying circuit is constituted by a supply voltage VCC of approximately 5 volts in order to be TTL compatible and is connected at one side of the circuit at line 85 and to ground potential at the other line 86, which corresponds to the substrate 10 of FIG. 1 being connected to ground potential. Another load resistor 87 is connected between line 85 and node 72 and completes the transimpedance amplifying portion of the circuit.

The operational amplifier includes an NPN bipolar transistor 90 having its collector and emitter terminals connected between a node 92 and line 86. A resistor 94 is connected between node 96 and the base of transistor 90. A resistor 98 is connected between nodes 72 and 96, and resistor 100 is connected between node 96 and 92. A load resistor 102 is connected between the supply voltage at line 85 and the collector of transistor 90.

The output amplifying stage comprises an output transistor 110 having a Schottky-barrier diode 112 connected between its base and collector terminals. The Schottky-Barrier diode is not a necessary element of the present invention but in some applications can be used to optimize operation. The specific transistor Schottky-barrier diode arrangement is disclosed in U.S. Pat. No. 3,649,883, issued March 14, 1972, and assigned to the same assignee of the present invention. A resistor 114 is connected between node 92 and the base terminal of transistor 110, and an optional load resistor 116 is connected between the supply line 85 and the collector of transistor 110 at node 118 which also constitutes the voltage output node which in turn is connected to voltage output line 120 for providing an output voltage Vout.

An undesirable parasitic capacitor 122 exists between node 118 and the cathode of diode detector 66 at node 124. The value of this parasitic capacitor 126 is normally less than 0.2 micro-micro farads and is typically in the order of 0.05 micro-micro farads.

In the preferred embodiment, the radiation source is depicted as an LED; however, other suitable radiation type sources can be employed.

OPERATION

Assuming that radiation 26 is emitted by the LED radiation source 18, approximately 6 – 10 microamperes (I1) is generated by the diode detector 66 assuming a drive current of approximately ten milliamps to the LED radiation source. This generated current discharges the substrate-epitaxial capacitor represented at 34 in FIG. 1 and also the shunt base-emitter capacitance of transistor 70 so as to turn transistor 70 off. This causes the collector of transistor 70 at node 72 to rise until a feedback current through resistor 40 equals the detector current I1. With the flow of current I1 a feedback current I2 is created from node 72 through resistor 68 until I1 equals I2. This causes node 72 to rise in voltage in the amount equal to the product of I2 times the ohmic value of resistor 40 minus the small voltage drop at the base of transistor 70. Accordingly, a detected current I1 is converted to a voltage at node 72 and thus the term trans-impedance amplifier. The voltage generated at node 72 is employed to drive the operational amplifier stage 83. Prior to the incident of radiation on diode 66, and assuming a beta of approximately 100 for transistor 70 about 250 microamps flows through resistor 87. The operational amplifier 83 possesses a gain of approximately eight, which is set by the ohmic ratio of resistor 100 over resistor 98 and the open loop voltage gain of transistor 90. The ratio of the emitter areas of transistor 90 over that of transistor 70 is set equal to approximatey 1.3 in order to compensate for their difference in respective emitter currents and the voltage drop across resistor 40 due to the base bias current for transistor 70.

Resistor 94 is added to compensate for a beta range 50 to 500 which normally would cause the base drive currents of transistors 70 and 90 to change drastically. Also, it is noted that because of this configuration, the base voltage bias of transistor 90 is temperature compensated with respect to that of the output of transistor 70. Resistor 102 compensates resistor 87 for temperature changes as well as for absolute values caused by processing tolerances. Resistor 114 which connects output node 92 from the operational amplifier 83 to the output transistor 110 is optional but in this particular embodiment is introduced to limit the slew rate of output transistor 110 in order that the parasitic feedback through capacitor 122 to the detector diode 66 at node 124 does not cause spurious oscillations during switching.

As previously discussed the option of an output transistor 110 with a Schottky-barrier recombination ring is optional in order to reduce storage times for certain high speed applications. However, for data rates in the range of one megahertz, this configuration is unnecessary.

Node 92 drops approximately 400 millivolts when node 72 rises 50 millivolts, thus transistor 110 is turned off so as to generate an output voltage Vout approximately equivalent to VCC.

Figure 3:
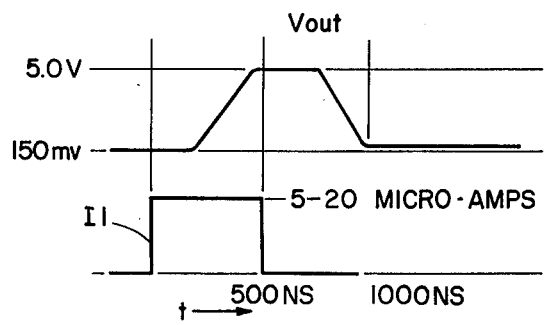
FIG. 3 illustrates typical generated voltage and current waveforms of the present invention.

When the light emitting diode is turned off, the capacitance shown in FIG. 1 as element 34 is recharged through resistor 40 causing node 124 to rise in voltage, causing transistor 70 to turn on more which causes node 72 to drop in voltage. This in turn causes node 92 to rise causing output transistor 110 to be turned on by base drive current through resistor 114. Thus, the output voltage goes to approximately ground potential or more specifically, 150 millivolts which is the collectorto-emitter saturation voltage. The generated diode current I1 and output voltage waveforms for the present embodiment are illustrated in FIG. 3.

The exact values of resistors are unimportant, since the circuit is designed primarily to be sensitive to the ratio of resistors only. Furthermore, the overall circuit performance is relatively independent of supply voltages and capable of operating in a range of 2 volts to an excess of 10.0 volts. The value of 5.0 volts is arbitrarily selected in order that the output voltage Vout is compatible with TTL logic circuitry. The operational amplifying nature of the second stage is further improved performance wise, under certain circumstances, in that transistor 90 is quickly pulled out of saturation after the LED is overdriven and when the light emitting diode is turned off.

Another feature of the present circuit is that the detector capacitance is minimized by the use of the substrate-epi junction diode. The capacitance value can be further minimized by including a thin high resistivity N-layer at the PN junction 30 in the structure of FIG. 1 if even lower capacitance is desired (not shown).

While the invention has been particularly shown and described in reference to the preferred embodiments thereof, it will be understood by those skilled in the art that changes in form and details may be made therein without departing from the spirit and scope of the invention.

What is claimed is:

1. An integrated circuit detector means responsive to an incident radiation supply means for generating an output current comprising:
    a. a body of semiconductor material for receiving the incident radiation at a first surface;
    b. said body comprising a substrate of a first conductivity type and an overlying layer of opposite conductivity type, said substrate having second and third surfaces separated from said first surface, said second surface being disposed intermediate to said first and third surfaces;
    c. a subsurface PN junction detector means located at approximately said second surfaces coupled to a reverse bias supply means for absorbing substantially all incident radiation and generating an output current;
    d. at least a first active device having active regions disposed in said overlying layer and coupled to said subsurface PN junction.

2. An integrated circuit detector means responsive to an incident radiation supply means for generating an output current as in claim 1 wherein:
    a. said substrate comprises a P type conductivity material, and said overlying layer comprises a N type conductivity material.

3. An integrated circuit detector means responsive to an incident radiation supply means for generating an output current as in claim 2 further including:
    a. isolating regions extending from said first surface to said second surface for electrically isolating said subsurface PN junction detector means from said first active device.

4. An integrated circuit detector means responsive to an incident radiation supply means for generating an output current as in claim 3 wherein:
    a. said overlying layer is an epitaxial layer.

5. An integrated circuit detector means responsive to an incident radiation supply means for generating an output current as in claim 4 wherein:
    a. said first active device comprises an NPN transistor having a collector region constituted by a portion of said epitaxial layer and base and emitter regions disposed in said epitaxial layer.

6. An integrated circuit detector means responsive to an incident radiation supply means for generating an output current as in claim 5 further including:
    a. an N type contact region disposed into said epitaxial layer for providing a low electrical resistance contact to said subsurface PN junction detector means for coupling to said first active device.

7. An integrated circuit detector means responsive to an incident radiation supply means for generating an output current as in claim 6 further including:
    a. a plurality of other active and passive devices disposed in said epitaxial layer coupled to said PN junction detector means.

8. A detector means responsive to an incident radiation supply means for generating an output current comprising:
    a. a substrate of a first conductivity type;
    b. an epitaxial layer of opposite conductivity type disposed over said substrate for forming a subsurface PN junction detector means;
    c. means coupled to said PN junction detector means for reverse biasing said subsurface PN junction detector means; and
    d. said substrate and epitaxial layer constituting first and second active regions for generating the output current in response to the incident radiation.

9. A detector means response to an incident radiation supply means for generating an output current as in claim 8 wherein:
    a. said substrate comprises a P type conductivity material and said epitaxial layer comprises a N type conductivity material.

10. A detector means responsive to an incident radiation supply means for generating an output current as in claim 9 further including:
    a. active and passive devices disposed in said epitaxial layer and coupled to said PN junction detector means for forming an integrated circuit detector means.

11. A detector means responsive to an incident radiation supply means for generating an output current as in claim 10 further including:
    a. isolating regions extending through said epitaxial layer to said substrate for electrically isolating said subsurface PN junction detector means from said active and passive devices.

12. A detector means responsive to an incident radiation supply means for generating an output current as in claim 11 wherein:
    a. said epitaxial layer includes an N type contact region disposed therein for providing a low electrical resistance contact to said subsurface PN junction detector means for interconnection to said active and passive devices.

13. A detector means responsive to an incident radiation supply means for generating an output current as in claim 12 further including:
    a. terminal means coupled to said substrate;
    b. said terminal means and said N type contact region receiving the output current from said subsurface PN junction detector means for driving said active and passive devices.

* * * * *